United States Patent [19]

Boland et al.

[11] Patent Number: 5,001,075

[45] Date of Patent: Mar. 19, 1991

[54] FABRICATION OF DIELECTRICALLY ISOLATED SEMICONDUCTOR DEVICE

[75] Inventors: Bernard W. Boland; Paul W. Sanders, both of Scottsdale, Ariz.

[73] Assignee: Motorola, Schaumburg, Ill.

[21] Appl. No.: 333,065

[22] Filed: Apr. 3, 1989

[51] Int. Cl.$^5$ ............................................ H01L 21/331
[52] U.S. Cl. ........................................ 437/33; 437/62
[58] Field of Search ................. 437/33, 67, 77, 78, 437/62

[56] References Cited

U.S. PATENT DOCUMENTS

| | | | |
|---|---|---|---|
| 3,407,479 | 6/1965 | Fordemwalt et al. | 29/577 |
| 3,431,468 | 4/1967 | Huffman | 317/101 |
| 3,457,123 | 7/1969 | Van Pal | 148/15 |
| 3,461,003 | 8/1969 | Jackson, Jr. | 148/175 |
| 3,508,980 | 4/1970 | Jackson, Jr. et al. | 148/175 |
| 3,876,480 | 4/1975 | Davidsohn et al. | 156/17 |
| 3,902,936 | 9/1975 | Price | 156/3 |
| 3,929,528 | 12/1975 | Davidson et al. | 148/175 |
| 4,566,914 | 1/1986 | Hall | 357/42 |
| 4,649,630 | 3/1987 | Boland et al. | 29/580 |

FOREIGN PATENT DOCUMENTS

| | | | |
|---|---|---|---|
| 52-43385 | 4/1977 | Japan | 437/62 |
| 55-154744 | 12/1980 | Japan | 437/62 |
| 57-130448 | 8/1982 | Japan | 437/62 |
| 59-186340 | 10/1984 | Japan | 437/62 |
| 59-186341 | 10/1984 | Japan | 437/62 |
| 60-17928 | 1/1985 | Japan | 437/26 |

OTHER PUBLICATIONS

Paul Sanders, "An Inexpensive Silicon Monolithic IC Process for Microwave Low and Medium Power Circuits", Proceedings RF Expo-West, Feb. 15, 1989, pp. 353–357.

Primary Examiner—O. Chaudhuri
Assistant Examiner—George R. Fourson
Attorney, Agent, or Firm—Robert M. Handy

[57] ABSTRACT

Improved dielectrically isolated semiconductor structures especially suited for very high frequency bipolar transistors are produced. Recesses are formed in a (e.g., N+) single crystal semiconductor wafer, the wafer surface is coated with a dielectric, and a thick polycrystalline semiconductor layer is deposited thereon to provide a support. The single crystal wafer is back-lapped to expose dielectrically isolated N+ islands located between the original recesses. Depressions are etched in the N+ islands and the exposed surface is covered by a more lightly doped (e.g., N−) semiconductor layer which is, generally, single crystal above the N+ islands and non-single crystal therebetween, and which at least fills the depressions. The structure is then planarized (e.g., by lapping and etching) to remove this non-single crystal material and give isolated single crystal islands having a surrounding N+ periphery and an N− central epi region of well controlled thickness and a smooth outer surface suitable for device formation. Bipolar transistors of excellent properties are formed by providing a nested base and emitter within the central region. Other types of devices may also be formed. The surrounding N+ periphery automatically provides a buried layer and buried layer contact.

5 Claims, 2 Drawing Sheets

FABRICATION OF DIELECTRICALLY ISOLATED SEMICONDUCTOR DEVICE

FIELD OF THE INVENTION

This invention relates to semiconductor devices and, more particularly, to dielectrically isolated semiconductor devices.

BACKGROUND OF THE INVENTION

Dielectric isolated devices and circuits, generally denoted by "DIC", have long been known in the semiconductor art. They comprise devices and circuits in which the components (transistors, diodes, resistors, etc.) are formed in single crystal semiconductor tubs or islands embedded in an insulated supporting matrix, for example, a polycrystalline semiconductor such as polysilicon with a dielectric liner between the poly and the single crystal island. Each island of single crystal semiconductor material is separated from the supporting matrix and the adjacent islands by the dielectric liner. Hence, there is excellent electrical isolation between the individual islands and low parasitic capacitance. However, the packing density is comparatively low since, generally, only one device is placed in each island and space must be left between the islands for the dielectric liner and separating poly support matrix. Typical DIC methods and structures are described in U.S. Pat. Nos. 3,407,479, 3,431,468, 3,457,123, 3,461,003, 3,508,980, 3,876,480, 3,902,936, 3,929,528, and 4,649,630 which are incorporated herein by reference.

The process by which DIC structures are made is much more arduous than the processes conventionally used for most other types of semiconductor devices and circuits This is because great effort must be expended in obtaining the basic DIC wafer with the isolated single crystal islands before the conventional device formation process may begin. Further, dimensional tolerance control is vastly more difficult with DIC wafers because of the need to remove the bulk of the original substrate from which the islands are obtained. In particular, it is very difficult to control the precise thickness of the isolated single crystal islands across the DIC wafer There is an ongoing and long felt need for improved DIC structures and fabrication processes in which critical device dimensions are less susceptible to process variations. Accordingly, it is an object of the present invention to provide an improved configuration and process for DIC structures which are less susceptible to process variations. It is a further object of the present invention to provide an improved configuration and process for DIC structures wherein a buried layer and buried layer contact, and an epi region of well controlled thickness, are provided in selected islands, even though the island thickness varies substantially.

SUMMARY OF THE INVENTION

The above and other objects and advantages are obtained by a structure formed by the method comprising, in a preferred embodiment, providing a single crystal semiconductor having a first predetermined conductivity and type and first and second principal surfaces, providing a recess in the first surface, providing a dielectric layer on the first surface, providing a material for supporting the first surface, removing from the second surface a first portion of the single crystal semiconductor sufficient to expose a part of the dielectric layer and/or the supporting material and a second portion of the single crystal semiconductor, removing a part of the second portion of the single crystal semiconductor, and replacing the removed part with a further single crystal semiconductor of a second conductivity different than the first conductivity and having an outer surface extending at least to the exposed part of the dielectric layer.

It is desirable to use a polycrystalline semiconductor material for supporting the single crystal semiconductor and to replace the removed part of the semiconductor by epitaxial growth. Where the original single crystal semiconductor material is to function partly as a buried layer and buried layer contact, as for example in a bipolar transistor, it is desirable that the further semiconductor material be of the same type as the original semiconductor material and of a lower conductivity.

In a preferred embodiment the second removing step exposes an interior surface within the second portion of the single crystal semiconductor and the step of replacing the removed part comprises forming a layer of a further semiconductor which is substantially non-single crystal on the exposed part of the dielectric layer and/or the support material, and is substantially single crystal on the exposed interior surface, and then removing the non-single crystal portion. The non-single crystal portion is conveniently removed at least partly by abrasion and the outer surface of the further single crystal semiconductor is planarized.

As used herein whether in singular or plural form, the word "conductivity" refers to the specific conductance of a material, typically expressed in reciprocal ohm-cm, and the word "type" refers to the predominant conduction mechanism, i.e., either predominantly hole conduction (P-type), electron conduction (N-type), or ambipolar conduction (intrinsic or I-type). The various aspects of the invention will be more fully understood from the accompanying figures and the description that follows.

For convenience of explanation and understanding of the figures, regions which are illustrated as comprising, for example, polycrystalline semiconductor are stippled, regions that are illustrated as comprising, for example, dielectric are hatched, and regions that are illustrated as comprising single crystal semiconductor or metal are clear. Such convention is merely for convenience of explanation and is not intended to limit the various regions to these particular embodiments.

Also for convenience of explanation, the prior art and the present invention are illustrated in terms of silicon semiconductor and for particular conductivity types suitable for forming NPN bipolar transistors. This is merely for ease of understanding and not intended to limit the invention to the particular embodiments illustrated.

Those of skill in the art will appreciate, based on the description herein, that other materials, conductivities, types, devices and arrangements may also be used.

DETAILED DESCRIPTION OF THE FIGURES

Figure 1:
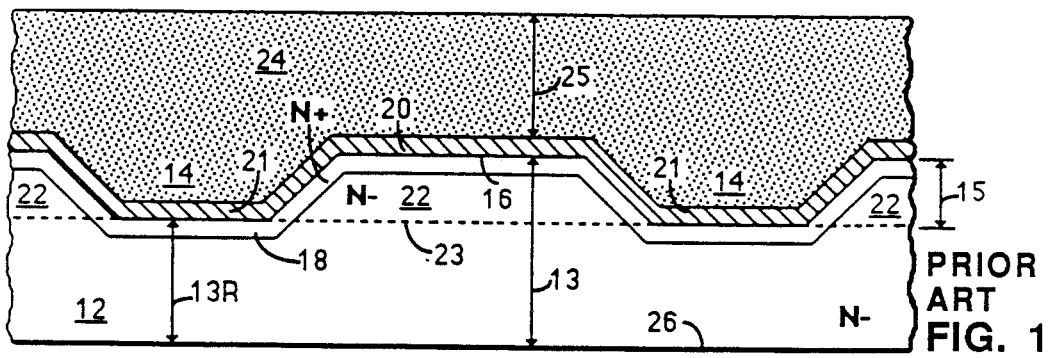
FIGS. 1–4 show simplified cross-sectional views of a portion of a DIC semiconductor wafer at various stages of fabrication according to the prior art.
Figure 2:
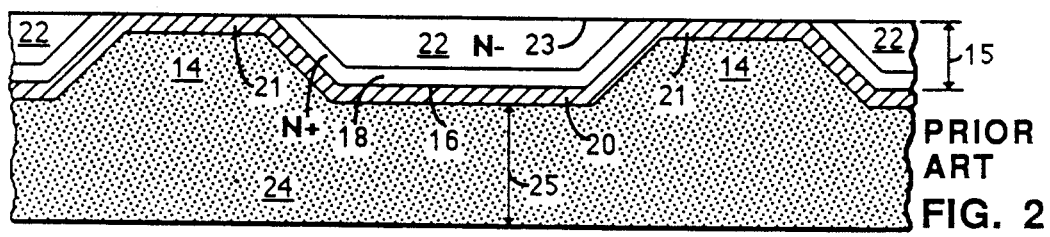
Figure 3:
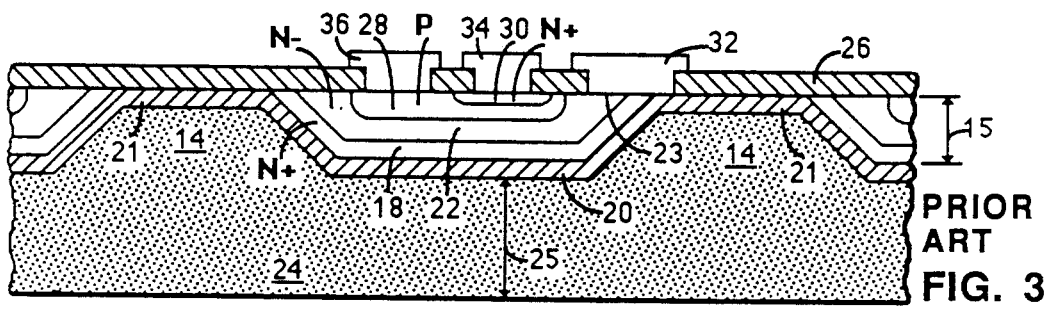

FIGS. 1-3 show simplified cross-sectional views of a portion 10 of a DIC wafer according to the prior art during various stages of fabrication. Single crystal semiconductor substrate 12 of thickness 13 is etched to form cavities 14 of depth 15 in first outer surface 16. In the prior art, where it is desired to form bipolar transistors, substrate 12 is usually $N^-$ and surface 16 of substrate 12, including the surface of newly formed cavities 14, is doped $N^+$ in region 18 to provide the equivalent of a buried layer. Dielectric 20 is applied and/or grown over surface 16. Dielectric 20 is typically silicon oxide or silicon nitride or a combination thereof Region 22 of substrate 12 is left between cavities 14. Dashed line 23 indicates for later reference the approximate level of the bottoms of cavities 14 in region 22. Support 24 of, for example, polysilicon, and having thickness 25 is then formed on dielectric 20. Means and methods for forming the structure of FIG. 1 are well known in the art.

As shown in FIG. 2, substrate 12 is then thinned from second surface 26 until portions 21 of dielectric 20 are re-exposed, approximately at a level coincident with dashed line 23 of FIG. 1 which now becomes freshly exposed surface 23 of remaining portions 22 of single crystal substrate 12. FIG. 2 is flipped vertically with respect to FIG. 1 which is the convention in the art. Single crystal regions 22 having outer surface 23 form the single crystal islands in which the desired devices of whatever nature are to be built.

FIG. 3 shows the structure of FIG. 2 with a bipolar transistor formed therein having insulating surface dielectric 26, P type base region 28, $N^+$ emitter region 30 and metal contacts 32, 34, 36. $N^+$ region 18 functions as a buried layer and buried layer contact extending from the bottom of island 22 to surface 23 wherein it may be contacted by metal 32. The portion of $N^-$ region 22 between buried layer 18 and base region 28 functions as the collector region of the bipolar device Means and methods for forming the structure illustrated in FIG. 3 are well known in the art.

A substantial difficulty with the structure and method of the prior art illustrated in FIGS. 1-3 is that, because wafer thickness 13 must be many times greater than cavity depth 15, the portion 13R of substrate 12 that must be removed is also very large. The process of removing portion 13R of substrate 12 is referred to in the art as "shaping back" or "shaping out" and is prone to substantial variation, even across the same wafer. As a consequence, one portion of the DIC wafer may be perfectly shaped back, as illustrated in FIG. 2, while in another portion of the same DIC wafer where shaping has proceeded further, a portion of layer 21, and possibly part of region 14, may have been removed so that the thickness of material 22 left in adjacent islands is no longer equal to thickness 15 but is substantially reduced. Hence, from wafer to wafer and within an individual wafer it is very difficult to control the thickness of $N^-$ region 22 between shaped-out surface 23 in which the devices will be constructed and buried layer 18. As a consequence, with bipolar transistors for example, and despite significant effort being expended to control the shape-back process, there is substantial variation in the collector thickness and a corresponding variation in the resulting transistor properties. This is highly undesirable since it reduces manufacturing yield and increases cost.

Figure 4:
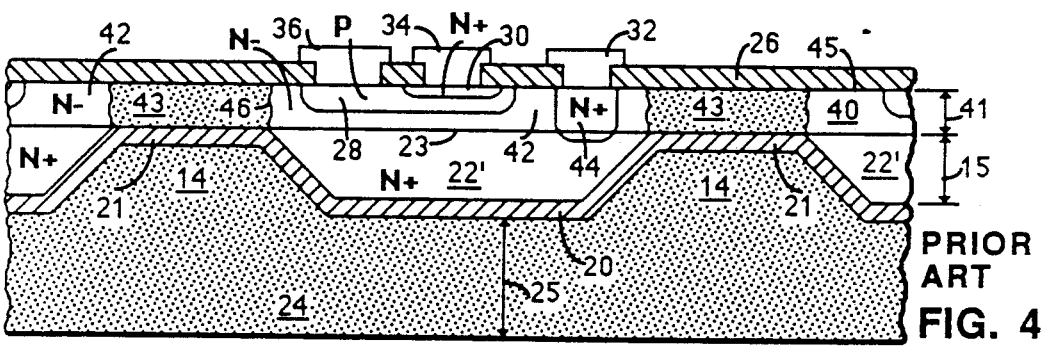

FIG. 4 illustrates an improved prior art process and structure in which islands 22', analogous to islands 22, are completely $N^+$ Following shape-back to the situation analogous to FIG. 2, $N^-$ semiconductor layer 40 of thickness 41 is applied to surface 23. Portion 42 of layer 40 forms epitaxially on single crystal region 22'and is also single crystal. Portion 43 of layer 40 which contacts dielectric region 21, and/or support 24 if dielectric 21 has been locally removed by extended shape-out, is non-single crystal, e.g., polycrystalline or amorphous. Joint 46 exists between regions 43 and 42. An advantage of the structure of FIG. 4 is that thickness 41 of epi-layer 40 is not affected by variations in the shape-out process, hence transistors of more carefully controlled properties may be obtained. A bipolar transistor comprising base 28, emitter 30 and contacts 32, 34, and 36 is shown in FIG. 4 $N^+$ doped region 22' acts as the buried layer for the device Process steps for forming the structure of FIG. 4 are well known in the art.

A difficulty with the process and structure of FIG. 4 is that a comparatively deep diffusion or other doping step must generally be provided to form $N^+$ collector contact region 44 extending through portion 42 of epi-layer 40 from buried layer region 22' to outer surface 45 of epi-region 42. A further difficulty is that sometimes joint 46 between single crystal portion 42 and poly portion 43 is rough creating surface steps that can interfere with interconnections extending thereover. Thus, even though the process described in connection with FIG. 4 provides a structure of much improved properties and manufacturing uniformity compared to the prior art illustrated in FIGS. 1-3, further improvement is desirable.

The foregoing and other problems are overcome by the method and structure of the present invention illustrated in FIGS. 5-11. FIGS. 5-11 are simplified cross-sections of portion 50 of a DIC wafer, analogous to FIGS. 1-4, but according to a preferred embodiment of the present invention, and at various stages of fabrication. The individual steps employed in forming the structures illustrated in FIGS. 5-11 are well known in the art and similar to the individual steps used in forming the structures of FIGS. 1-4. However, they are performed in a different order and result in a different structure.

Starting substrate 12 may be entirely single crystal and heavily doped (e.g., $N^+$) throughout thickness 13 or merely have a surface region of thickness 15 which is single crystal and heavily doped. Either arrangement will suffice, since material approximately of thickness 13R of substrate 12 below line 23 is removed during processing. Ordinarily thickness 13 is of the order of 800-900 micrometers, while thickness 15 is usually in the range 50-65 micrometers, with 60 micrometers being typical. Larger or smaller values of thickness 13 may be used so long as the thickness provides sufficient mechanical strength for substrate 12, depending on its diameter, to withstand the necessary processing steps. The appropriate value of depth 15 depends upon the types of devices to be fabricated in and/or on islands 22'. Those of skill in the art will understand how to choose appropriate values of thickness 13 and depth 15.

Figure 5:
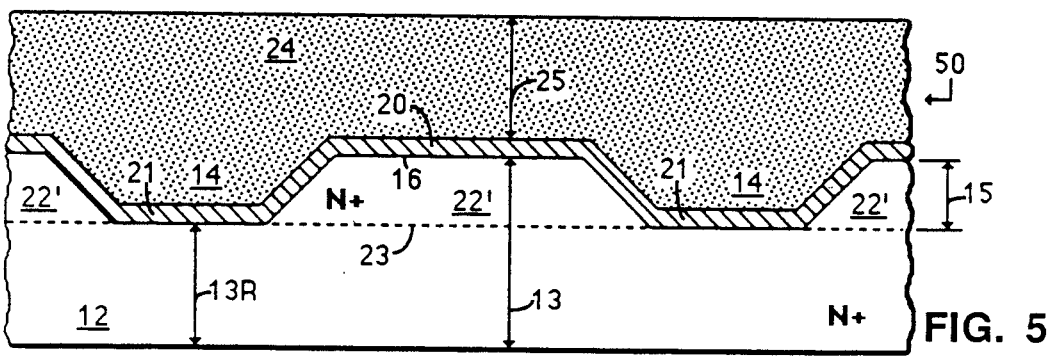
FIGS. 5–11 show simplified cross-sectional views of a portion of a DIC semiconductor wafer at various stages of fabrication according to the present invention.
Figure 6:
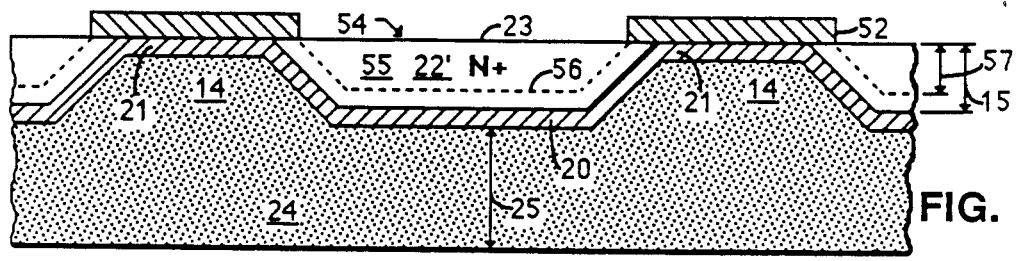

Substrate 12 is etched or otherwise treated to form cavities 14 of depth 15 in surface 16. Surface 16, including the interior of cavities 14 is covered by dielectric layer 20 having portions 21 on the bottoms of cavities 14. Regions 22' lying laterally between cavities 14 and vertically between line 23 and surface 16 will form the islands in and/or on which the desired devices will ultimately be formed. Dashed line 23 indicates for future reference the approximate level of the bottoms of cavities 14 and the approximate location of surface 23 (see FIG. 6) which will be subsequently exposed following shape-out. Thickness 13R indicates the approximate amount of material of substrate 12 which is removed to expose surface 23. Means and methods for forming the structure shown in FIGS. 5-6 are well known in the art. FIGS. 6-11 are inverted with respect to FIG. 5 as is the custom in the art.

Figure 7:
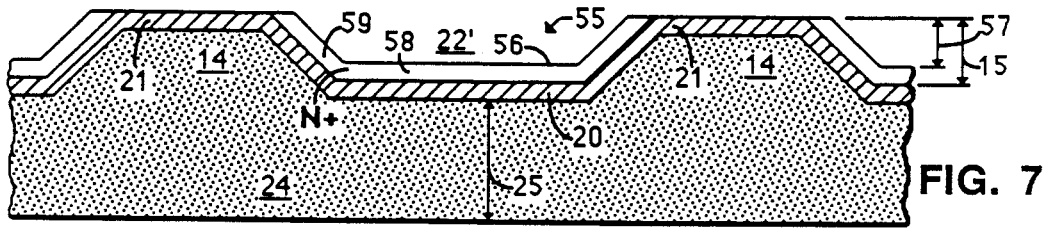

After the structure of FIG. 5 has been shaped-back approximately to surface 23, for example by mechanical lapping and/or chemo-mechanical polishing techniques well known in the art, mask 52 having opening 54 located over island 22' is applied (see FIG. 6). Then cavity portion 55 of island 22' is removed to depth 57 as shown by line 56 which denotes the freshly exposed surface within island 22' (see FIG. 7). Mask 52 may be of any material which resists the etchants or other means used for removing portion 55 of region 22' to expose surface 56. Mask 52 may be organic or inorganic and suitable materials are well known in the art. Means for etching cavity or depression 55 in island 22' are well known in the art. As indicated in FIG. 7, N+ portion 58 remains on the bottom and N+ portion 59 remains on the sides of island 22' in depression 55 in contact with dielectric 20.

Figure 8:
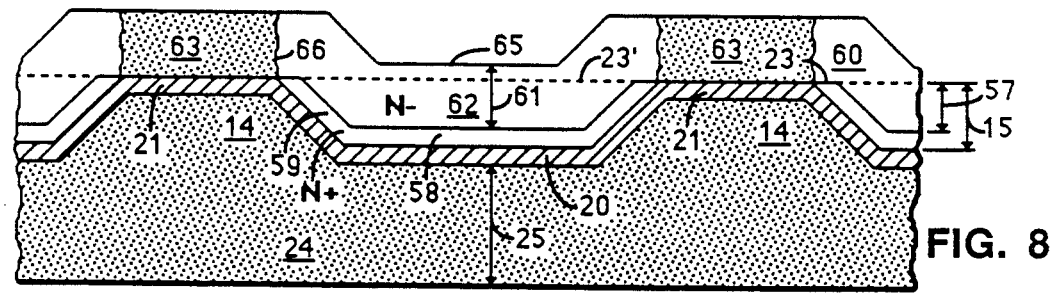

Referring now to FIG. 8, layer 60 of thickness 61 of semiconductor material is formed on surfaces 23 and 56. It is important that thickness 61 equal or exceed depth 57 so that surface 65 of portion 62 of layer 60 above regions 58, 59 extends beyond line 23', denoting in FIG. 8, the approximate level of the furthest extending outermost surface after depressions 55 have been formed. In FIG. 8 this corresponds approximately to the outermost surface of dielectric regions 21. However, those of skill in the art will appreciate that during the initial shape-out, some or all of dielectric region 21 may be removed so that line 23' may extend to an exposed part of region 14 of support 24.

Where it is desired to subsequently form bipolar transistors, layer 60 is desirably of the same type as the single crystal material of substrate 12 used to form island 22' and is desirably more lightly doped, i.e., of lower conductivity, for example, N−. Layer 60 is preferably formed by epitaxial deposition such that portion 62 of layer 60 above regions 58, 59 is single crystal while portion 63 that forms above dielectric region 21 (or above support 24 in regions 14 if dielectric region 21 has been partially or completely removed during shape-out) need not be single crystal and may be polycrystalline or amorphous. Joint 66 exists between portions 62, 63. Means for forming layer 60 so that portion 62 is single crystal and portion 63 is non-single crystal are well known in the art.

Figure 9:
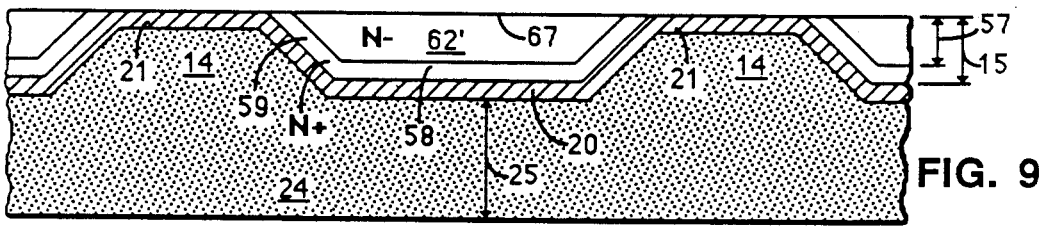
Figure 10:
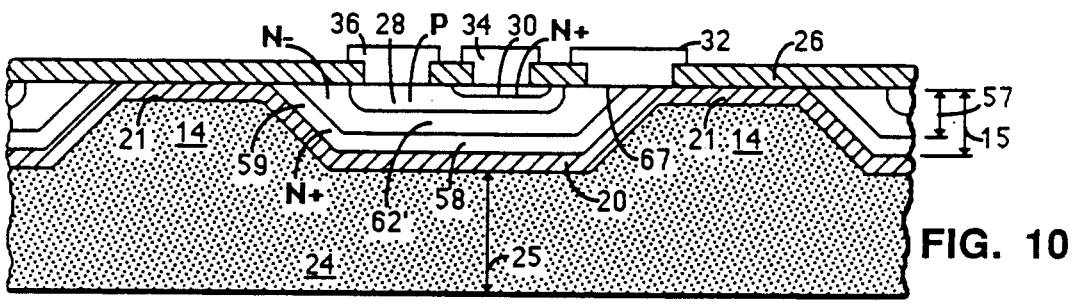

The structure of FIG. 8 is then shaped back again using means well known in the art to yield the structure of FIG. 9 wherein outer surface 67 is substantially planarized. N− single crystal region 62' of approximate thickness 57 now remains within N+ regions 58, 59. FIG. 10 shows the implementation of a bipolar transistor in single crystal island 62', 58, 59 and includes dielectric 26, P type base region 28, N+ emitter region 30 and contacts 32, 34, 36, as before. Means for forming such bipolar transistors are well known in the art.

Figure 11:
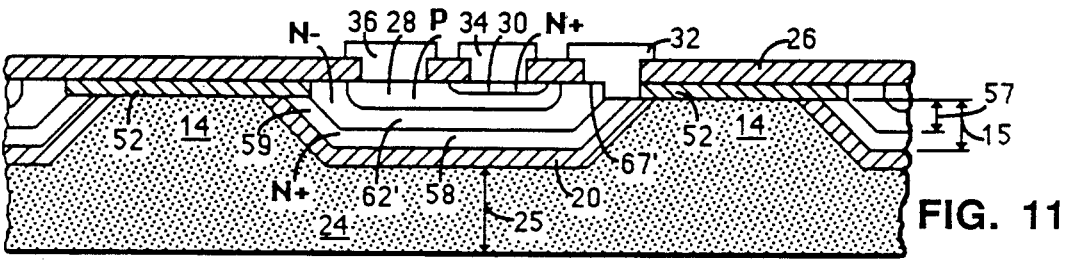

FIG. 11 shows substantially the same structure as in FIG. 10 but for the situation where, for example, the first shape-out step extends completely through dielectric 21 so that mask 52 in FIG. 6 now rests directly on portions 14 of support 24 between islands 62', 58, 59. In this situation it is desirable to use a hard material for mask 52 which can act as a lap stop as well as an etch mask. Mask 52 may be left in place during the formation of layer 60 in FIG. 8. It then can act as a lap-stop during the second shape-out step previously described in connection with FIG. 9. Once island portion 62', 58, 59 has been planarized, then the desired device may be formed as before, resulting in the structure shown in FIG. 11.

An advantage of the structure produced by the method of FIGS. 5-11, is that: (i) N+ regions 58, 59 are provided to serve as a buried collector and buried collector contact without having to perform either an additional doping step as was required to form prior art region 18 (see FIGS. 1-3) or an additional doping step to form prior art region 44 (see FIG. 4); (ii) the thickness of region 62' (e.g., the collector region of the bipolar transistor) does not depend upon variations in the first shape-out step for forming the structure of FIG. 6; and (iii) that thickness variations in the isolated islands caused by variations in the first shape-out step are accommodated by variations in the thickness of the highly doped regions 58, 59, which variations have little effect upon the characteristics of the finished devices so long as some minimum thickness is provided for regions 58, 59. It is the first shape-out step that involves removing the largest amount 13R of material from substrate 12, e.g., typically 740-840 micrometers of a 800-900 micrometer thick wafer, and which is most difficult.

The variation in final thickness of region 62' depends upon: (a) the step of FIG. 7 for etching depressions 55; and (b) the second shape-out step illustrated in FIGS. 8-9.

The step of etching depressions 55 may be carefully controlled to have a very small depth dispersion since the depression depth itself is comparatively small (e.g., typically 4-10 micrometers or less) and selective chemical etching may be used without mechanical abrasion. It is well known in the art that selective chemical etching of single crystal semiconductors is a particularly well controlled process susceptible to much greater precision than mechanical abrasion or lapping under comparable circumstances.

The accuracy of the second shape-out step depends upon the thickness of layer 60, which is also comparatively small and equal to or slightly larger than the depth of depressions 55. Hence, the thickness of region 62' left after the second shape-out step may be much more carefully controlled than in the prior art structures and process of FIGS. 1-3. As those of skill in the art will appreciate, region 21 of layer 20 acts as a lap stop thereby aiding obtaining thickness control during the first and second shape-out steps. It is proportionately more helpful during the second shape-out step because the amount of material being removed from layer 60 is much smaller and therefore there is less wear on the lap stop during the second shape-out and less chance for lap stop failure.

A further advantage of the present process is that even if region 21 has been damaged or removed during the first shape-out step it may be replaced and made available during the second shape-out step as has been illustrated in connection with FIG. 11 (e.g., see layer 52).

Thus, as will be apparent from the foregoing description, an improved configuration and process is provided for DIC structures that are less susceptible to process variations and wherein a buried layer and buried layer contact may be automatically obtained at the same time as an epi-region (e.g., a collector region) of well controlled thickness even though there may be a large variation in the thickness of the semiconductor island in which the epi-region (e.g., collector region) is formed. Further, the surface irregularity associated with the epipoly joint (e.g., interface 46 in FIG. 4) is eliminated.

Those of skill in the art will appreciate based on the description herein that many variations may be made in the structure and practice of the present invention without departing from the spirit thereof For example, and not intended to be limiting, while the exemplary structures and steps have been described in terms of NPN Bipolar transistors, those of skill in the art will appreciate that many other types of devices and components can be formed by the method of the present invention and other combinations of N and P regions utilized. Further, while silicon has been cited as a preferred material for the single crystal semiconductor regions, those of skill in the art will appreciate that other semiconductors, as for example germanium and/or germanium-silicon combinations and/or III-V's and other compounds may also be used. Accordingly, it is intended to include such variations in the claims that follow.

We claim:

1. A method for forming a dielectrically isolated NPN bipolar transistor, comprising:
    providing a substrate having therein a uniformly doped, single crystal, N+ semiconductor island extending substantially to an exposed surface of the substrate, wherein the N+ island has a bottom and side adjacent an insulating portion of the substrate;
    then etching a cavity within the N+ island, wherein the cavity is smaller and shallower than the island, so that a U-shaped portion of the uniformly doped N+ island is left in place against the insulating portion of the substrate as a collector contact;
    substantially refilling the cavity with N− semiconductor to provide a collector having an exposed outer surface; and
    forming in the N− collector, a P base and N+ emitter extending to the exposed outer surface.

2. A method for forming a dielectrically isolated PNP bipolar transistor, comprising:
    providing a substrate having therein a uniformly doped, single crystal, P+ semiconductor island extending substantially to an exposed surface of the substrate, wherein the P+ island has a bottom and side adjacent an insulating portion of the substrate;
    then etching a cavity within the P+ island, wherein the cavity is smaller and shallower than the island, so that a U-shaped portion of the uniformly doped P+ island is left in place against the insulating portion of the substrate as a collector contact;
    substantially refilling the cavity with P− semiconductor to provide a collector having an exposed outer surface; and
    forming in the P− collector, a N base and P+ emitter extending to the exposed outer surface.

3. The method of claim 1 wherein the substantially refilling step comprises, epitaxially growing N− semiconductor directly on the U-shaped portion of the uniformly doped N+ island to substantially refill the cavity.

4. The method of claim 3 wherein the epitaxially growing step comprises epitaxially growing N− semiconductor directly on the U-shaped portion of the uniformly doped N+ island without an intervening doping step.

5. The method of claim 1 wherein the providing step comprises (i) providing a single crystal semiconductor substrate having opposed first and second principal surfaces and with a uniformly doped N+ region of a first predetermined thickness extending to the first surface, (ii) removing a portion of the N+ region around a desired N+ island location on the first surface to a first depth about equal the first thickness, (iii) providing an insulator on the first surface, (iv) providing a supporting material on the dielectric, and (v) removing semiconductor material from the second surface of the substrate until at least a first portion of the dielectric around the desired island location is revealed thereby forming a newly exposed second surface of the substrate containing a uniformly doped, single crystal, N+ semiconductor island having a bottom and side adjacent a second portion of the insulator.

* * * * *